United States Patent [19]

Stevenson

[11] Patent Number: 5,093,624
[45] Date of Patent: Mar. 3, 1992

[54] BATTERY MONITORING

[75] Inventor: Peter R. Stevenson, Llansynior, United Kingdom

[73] Assignee: Yuasa Battery (UK) Limited, United Kingdom

[21] Appl. No.: 492,721

[22] Filed: Mar. 13, 1990

[30] Foreign Application Priority Data

Mar. 13, 1989 [GB] United Kingdom ............... 8905708

[51] Int. Cl.$^5$ ............................................. G01N 27/46
[52] U.S. Cl. ..................................... 324/426; 324/436; 324/437
[58] Field of Search ............... 324/426, 427, 436, 434, 324/437; 320/48; 340/636

[56] References Cited

U.S. PATENT DOCUMENTS 4,260,230 4/1981 Suzuki ............................... 320/39 X Primary Examiner—Kenneth A. Wieder
Assistant Examiner—Robert W. Mueller
Attorney, Agent, or Firm—Wall and Roehrig

[57] ABSTRACT

Monitoring state of charge of an electric storage battery (18) is done by deliberately inducing eddy currents, specifically using an induction coil (70) in conductive metallic constituents of negative plate material (74) of the battery concerned, and detecting effects representative of said eddy currents, specifically by detecting (76, 78) amplitude or frequency effects on energizing signals (72).

16 Claims, 4 Drawing Sheets

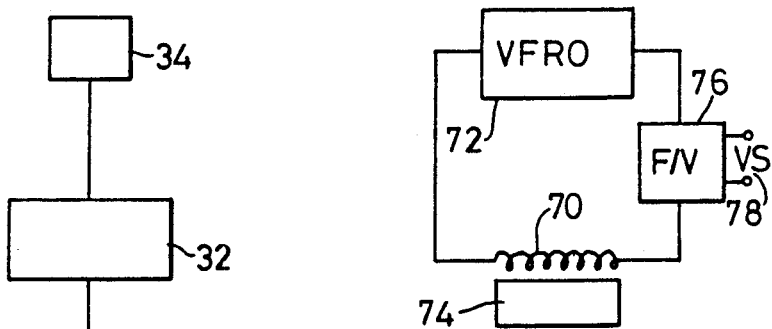
Fig. 3
Fig. 7
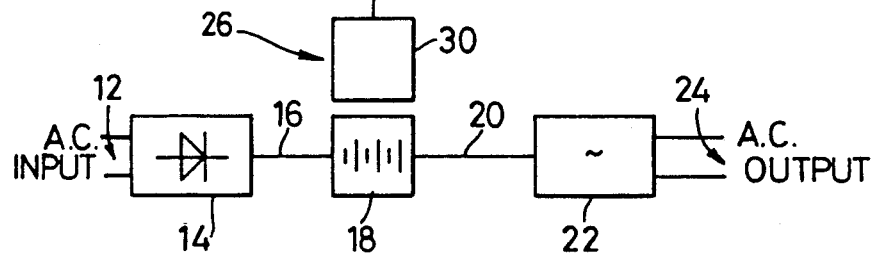
Fig. 4

BATTERY MONITORING

This invention relates to monitoring state of charge condition of an electric storage battery, and has application to current supply management systems using batteries at least as alternative sources of electric power.

Previously, state of charge conditions for lead acid type batteries has been determined or monitored by measurement of electrolyte specific gravity or battery voltage. However, such techniques are unsatisfactory for sealed lead acid batteries partly because electrolyte cannot be extracted for analysis without damaging the battery and partly because battery voltage is not directly proportional to state of charge.

It is intrinsic to sealed batteries that electrolyte is not accessible in the battery cells, and battery voltage is dependent on the conditions under which the battery is being used, for example ambient temperature and whether subject to charge current or supplying discharge current.

The most common method used for charging of lead acid batteries on a continuous basis is to supply to the battery terminals a fixed voltage of a value which will just allow sufficient current to flow into the fully charged battery to replace energy lost by spontaneous self-discharge of the battery active materials. In the case of sealed lead acid batteries this can lead to excessive heat generation at least when the ambient temperature is high enough to initiate a fast rate of oxygen production inside the battery at the selected charging voltage. That can result in damage to the battery case, loss of water from the battery and corrosion of grid material.

This problem has been particularly severe where oxygen recombination batteries have been used for starting, lighting and ignition purposes in relation to motor vehicles. Motor vehicle charging systems must operate in environmental conditions ranging from those pertaining in the arctic to those pertaining in the tropics. Moreoever, in central areas of large continental land masses, temperature variation during each year is often in excess of 60 deg C., and it is further the case that the operating temperatures within the engine compartment can be greater than 100 deg C. These factors disallow selection of a single value of charging voltage that is universally applicable, and that situation is compounded by different characteristics of different battery designs, even variations individually for batteries of the same basic type.

It is an object of this invention to provide battery charge monitoring that enables such problems to be mitigated.

Observations of variations in eddy currents which can be induced in battery negative plate active material dependent on their state of charge have been made giving rise to reduction in level of induced eddy currents as a battery approaches its fully charged condition, and are applied herein.

According to this invention, battery state of charge condition is monitored according to eddy currents deliberately induced in negative plate material of the battery concerned, conveniently using an externally applied varying magnetic field of suitable effective frequency, typically from an induction coil placed close to the outside of the battery case, though a specific housing compartment or attachment provision could be made in designing the battery case.

Selecting frequency of operation of the induction coil should bear in mind that practical sensors are presently unlikely usefully to detect much if anything below 1 KHz and extent of electrical field induced is unlikely to be enough for frequencies much if above 10 MHz at least from outside the battery. At lower frequencies, the coil and associated capacitive components, also the required power supply, could be too large for convenience. Specifically, of course, plate and container thicknesses of the battery will also be influential.

In general, this invention is applicable to any battery having material capable of supporting eddy-currents in a manner dependent on the state of charge of the battery. In practice, that effectively means negative plates having metallic conductive constituents as in lead-acid batteries including those of sealed oxygen regenerative type. Specifically, however, nickel-cadmium type batteries, which generally have flatter voltage/charge-state characteristics during discharge (than lead-acid batteries), are equally suitable for charge state monitoring using embodiments of this invention.

From testing commercially available inductive sensors operative at frequencies from about 50 kHz to about 300 kHz, particularly readily handled results are obtained when operating between 50 kHz and 100 kHz.

An initial value corresponding to full charge state of the battery can be obtained by measuring maximum amplitude for high frequency current signal produced while the battery is on floating charge.

It is, however, to be noted that frequency effects are also capable of utilisation to detect eddy current effects, or a combination of amplitude and frequency effects.

For any battery charging system, and with a view at least to preventing thermal damage to the battery, an inductive device embodying this invention or forming part of such embodiment and placed in eddy-current inducing relation with the battery being charged is useful and advantageous.

For continuous power supply systems, i.e. that ideally never suffer interruption, hereinafter called "uninterruptable", such as for providing a stable current source from batteries for electronic equipment in the event of a mains current supply failure, an inductive device embodying this invention or forming part of such embodiment is placed to induce eddy currents in at least a selected cell of the storage battery concerned. Then, such inductive device can continuously monitor the state of charge of the battery generally, and/or the rate of change of the state of charge of the storage battery while the battery is being discharged. This information can be processed to calculate an expected time for which the current (or any particular power) output can be maintained by the system before mains is available again.

Where a battery employs oxygen recombination technology to ensure maintenance-free operation an inductive device embodying this invention or forming part of such embodiment can detect a condition where oxygen gas is produced by the battery positive plates. The oxygen gas generated while charging the battery reacts with negative plate active material leading to a reduction in the eddy current induced and measured using the inductive device.

It is useful to note that the value of the induced eddy currents in the negative plate active material decreases while the battery is on charge and use can be made of means, conveniently including a switch, operative when required to limit charge current to a level that is unable to generate sufficient heat to damage the battery.

Such provisions applied to or incorporated into a charging system for a motor vehicle battery, typically to supply power for starting, lighting, ignition and ancilliary electrical equipment of the vehicle, can allow a single design of charging system to be used without adjustment across the widest range of possible climatic and other operating conditions, the limited charge current level simply being switched in for periods and at intervals assuring that battery charging is effective and not liable to cause damage.

Specific implementation of embodiments of this invention will now be described, by way of example, with reference to the accompanying drawings, in which:

FIG. 3 is a block diagram of a system for an uninterruptable power supply;

FIG. 4 is a schematic circuit diagram of a charging system for a motor vehicle battery;

FIG. 7 shows a simplified block circuit diagram for our inductive sensing device.

Figure 1:
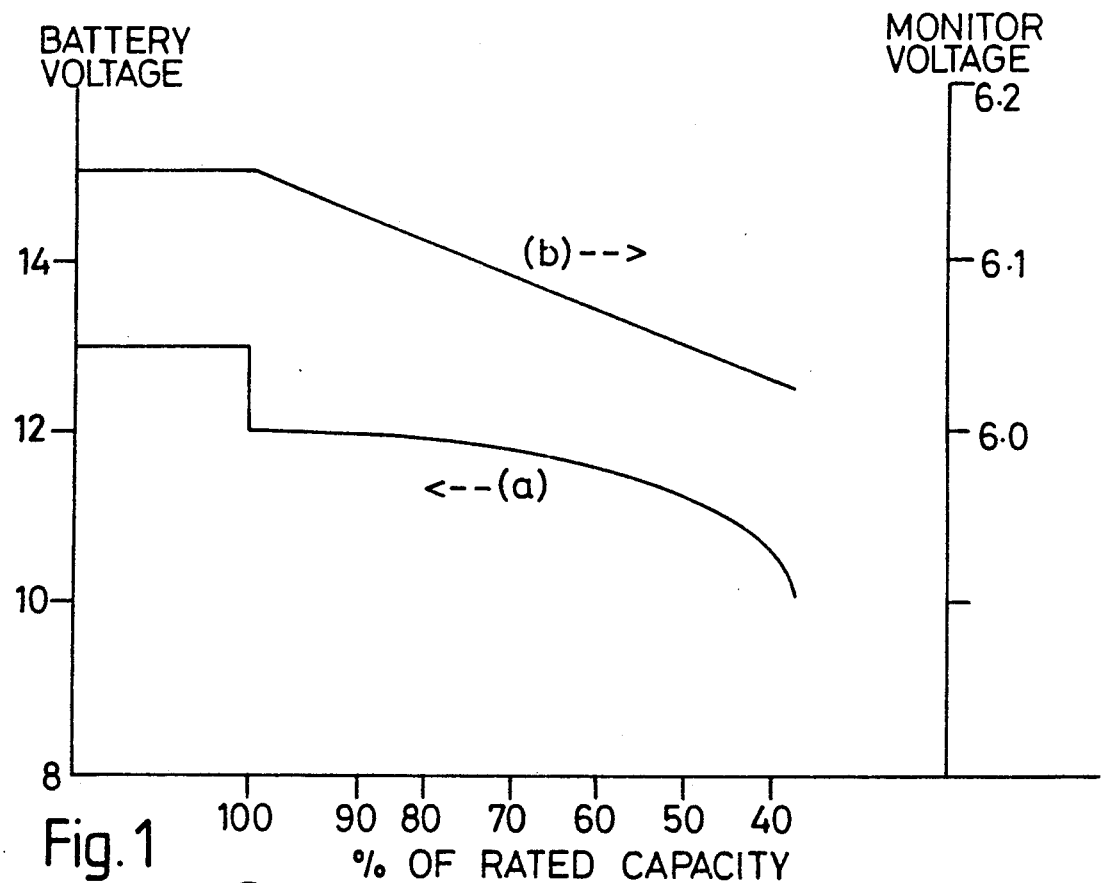
FIG. 1 is an idealised graph showing variation of battery voltages with state of charge and related/inductive monitoring.

Referring first to FIG. 1, line (a) represents variation of battery voltage (left ordinate) with state of charge of a battery (abscissa). That variation is clearly non-linear. Line (b) represents variation (with state of charge) of eddy-current dependent monitoring voltage (right ordinate) obtained by practising this invention. That variation is substantially linear. The lines (a) and (b) of FIG. 1 are idealised from test data obtained relative to a Yuasa Model NP7–12 battery, which is of sealed lead-acid type, using as an inductive device a Honeywell Model 924 inductive proximity sensor placed next to the battery case. Measured working frequency ranged from 75 KHz to 135 KHz and resulting current/voltage variation as shown in FIG. 1.

Figure 2:
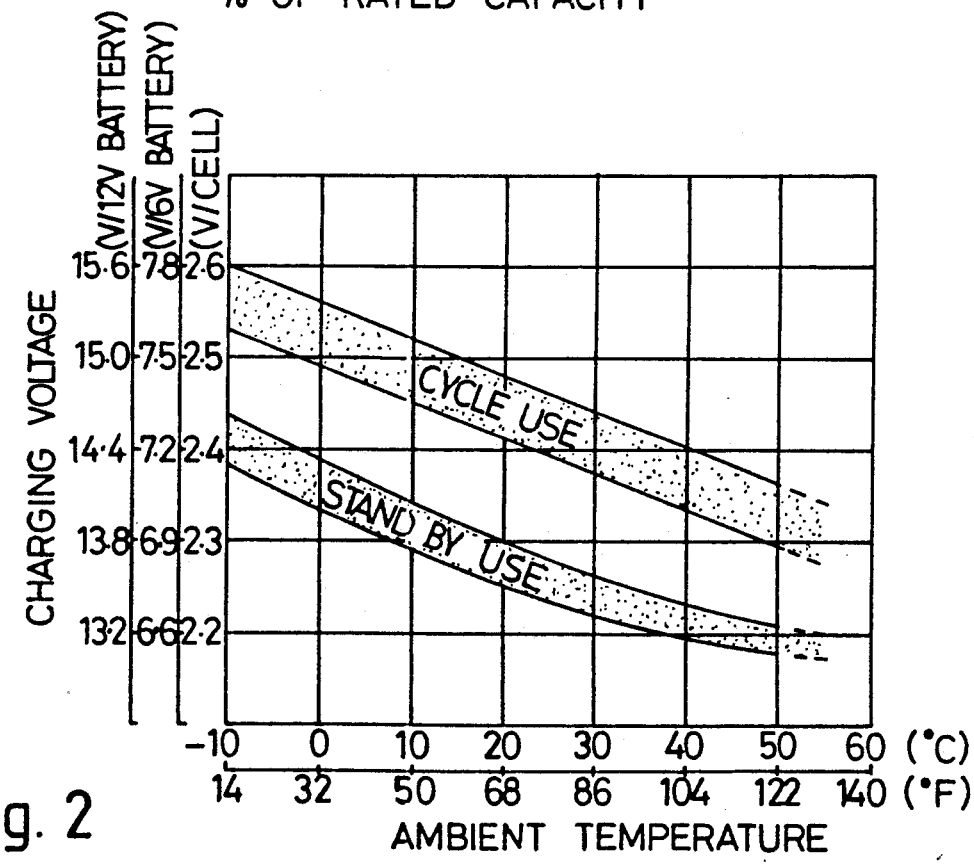
FIG. 2 is an idealised graph showing ranges of recommended charging voltages for oxygen recombination batteries against temperature.

FIG. 2 shows bands of recommended charging voltages for similar Yuasa 12 volt and 6 volt oxygen recombination batteries (leftmost and middle left ordinates) and on a per-battery-cell basis (rightmost left ordinate) over a range of ambient temperatures from −10° C. (14° F.) to above 50° C. (120° F.). One of the illustrated bands (upper) relates to batteries on continuous or cyclic use and the other illustrated band (lower) relates to batteries on stand-by use only. Manifestly, there is no single charging voltage that can be selected to serve for the whole range of operating conditions, even simply on a temperature basis for a particular model (size) of battery. Moreover, the slopes of the upper band shown in FIG. 2 can be different for different battery designs, and even for individual batteries of the same type, both of which further militate against ready application of charging current control according to temperature, particularly in a general way compatible with mass-production of motor vehicles.

FIG. 3 shows application of an embodiment of this invention to an uninterruptable electrical power supply (10) for such as electronic equipment, typically a computer installation, requiring permanent power on a stand-by or emergency basis in the event of failure of electric mains. Mains input is indicated at 12 going via a rectifier 14, thence over line 16 to a battery 18 for continuous charging purposes. Battery output 20 supplies an inverter 22 for alternating current output at 24. It will be appreciated that FIG. 3 shows only emergency supply provisions, and that some installations may not require inversion to provide a-c power.

Shown at 26 adjacent to the battery 18 is an inductive device 30, whose purpose is to induce and detect changes of eddy current effects in negative plate active material of the battery 18. A typical inductive device 30 will comprise an induction coil to generate a magnetic field in negative plate(s) of the battery 18, at least in part(s) or to extent(s) sufficient for inducing eddy currents with effects useful herein when energised at a suitable frequency or frequencies. Resulting eddy currents induced in negative plate active material of the battery cause reduction in current in the induction coil that is related to the charge state of the battery, increasing as the battery charges and decreasing as the battery discharges, see line b of FIG. 1.

The inductive device 30 is shown associated with signal processing means 32 and related display means 34. The processing means 32 will usually include calculating means for state of charge to the battery and for time for the battery to reach zero charge, or a charge below which electric and/or electronic equipment cannot be supplied safely. Then, operators will be able to judge how long the full installation can be run before at least partial close-down for a computer installation, say of electric drives first, then of active data processing.

FIG. 4 shows application to a motor vehicle battery 40 for starting, lighting, ignition and auxiliary equipment. Output from an a-c generator 42, typically of alternator type, goes by way of a rectifier 44 and voltage regulator 46 to a node 48 from which the vehicle load 50 is supplied. Also shown connected to the node 48 is a charge/discharge detector 52 with an associated switch 54 for controlling whether or not the battery 40 receives reduced charging current from the node 48 over charge current limiting device 56, or a higher level of charging current in the switch state shown. An inductive device hereof for detecting charge state of the battery is shown at 58 in proximity to the battery 40 and associated with a charge state controller 60 also connected to the charge/discharge detector 52.

A valve regulated or oxygen recombination lead acid battery has several advantages, including being substantially maintenance-free, compared with conventional flooded lead acid batteries for motor vehicle applications. Those advantages further include reduced weight and size, absence of spillable acid, safe operation in any orientation, and, of course, no requirement for water addition during operating life.

The preferred charging method for lead acid batteries is to use an electrical D.C. supply of fixed voltage and variable current output. For a particular temperature the charger voltage can be set so that when the battery is fully charged the charging current falls to a normal low level sufficient only to replace energy losses in the battery active materials. However, if the temperature of the battery is raised while this charging voltage is maintained an electrolytic reaction is promoted at the battery positive plates which generates oxygen gas. The oxygen gas diffuses to the battery negative plate where it combines with the spongy lead active material in an exothermic reaction. The oxidised lead is subsequently converted back to spongy lead to complete a cyclic process which results in the conversion of electrical energy into heat within the charged battery. Because the heat generated by oxygen recombination can raise the temperature of the battery a self-promoting mechanism exists which can lead to thermal runaway, resulting in damage to the battery and associated equipment. Reverting to FIG. 4, the battery charging system serves to limit the rate of oxygen production in charging the battery 40. The AC generator 42 produces a current which is rectified 44 and supplied at a voltage determined by the regulator 46. The direction of current into or out of the battery is detected by the detector 52, conveniently an ammeter. The state of charge of the battery is monitored by the inductive device 58 which induces high frequency eddy currents in the active material of the battery negative plates, and switching to a yet lower level of charging current is provided for.

Figure 5:
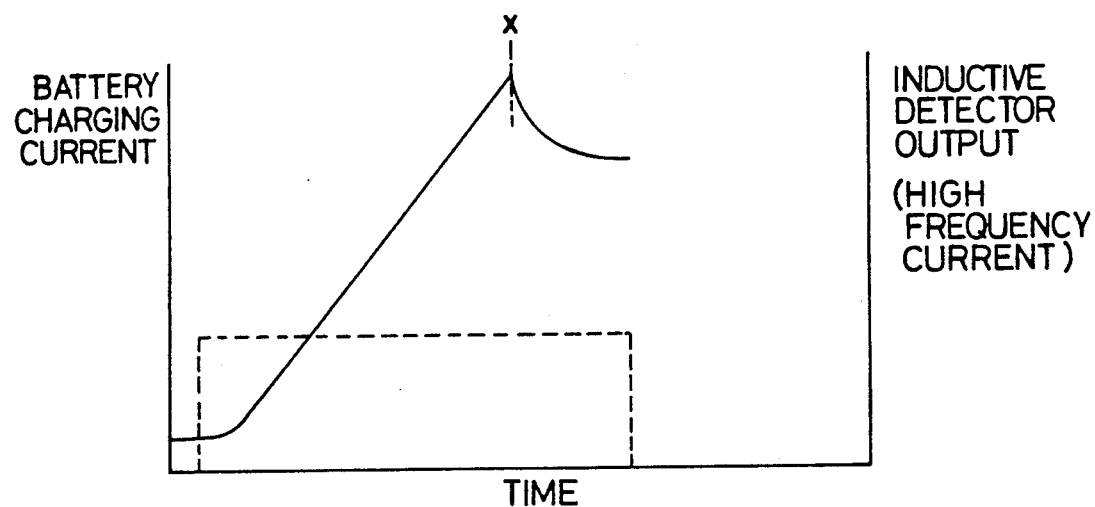
FIG. 5 is an idealised graph showing variation of eddy current activity in battery negative plates as the volume of active material increases.

As shown in FIG. 5, amplitude of the high frequency current increases as the volume of active material increases during charging up to a maximum (x). At this point, oxygen generation begins at the positive battery plates. The oxygen reacts with the surfaces of the negative active material particles resulting in a reduction of the amplitude of the eddy currents induced by the inductive device 58, typically an electromagnetic coil. When the charging controller 60 detects both that a charging current is flowing and that the amplitude of eddy currents in the negative active material is decreasing it causes the switch 54 to change from the illustrated state (1), which is direct connection of charger to battery, to its other state (2) which includes a current limiting device 56.

Figure 6:
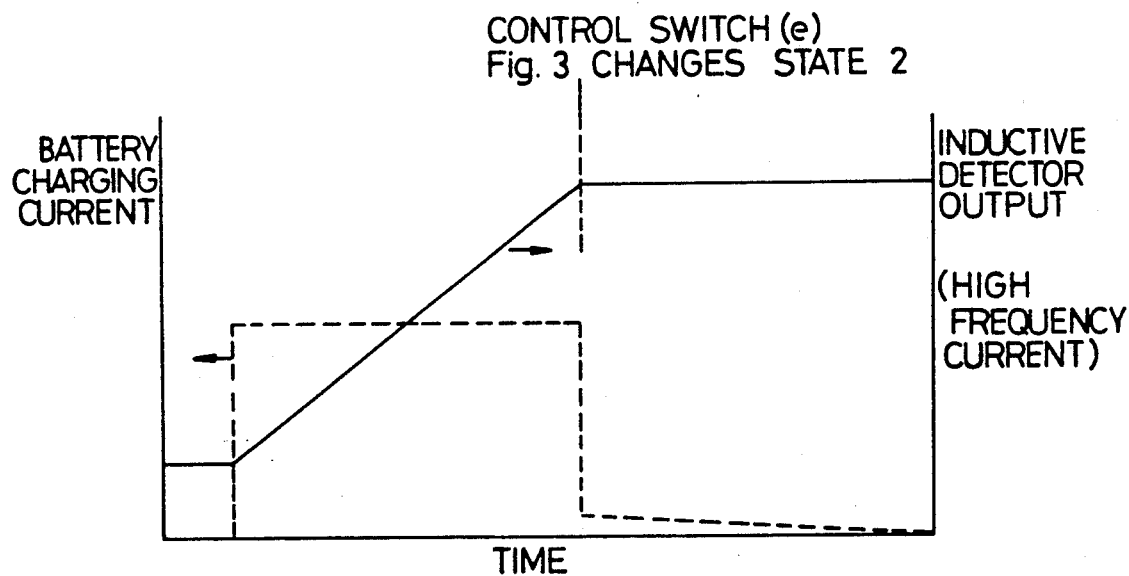
FIG. 6 is an idealised graph showing how to maintain safe charging current levels for a wide range of temperature variation.

In that way, the effects of battery charging current can be maintained within safe levels for a wide range of operating conditions, particularly temperatures, without restricting the "normal" charging current available to bring the battery to full charge condition. This is shown in FIG. 6. The control switch 56 resets to state (1) when the vehicle ignition is switched off or net discharging current is detected at ammeter 52.

It will be appreciated that showing of a resistor as the (further) charge current-limiting device 56 is schematic only, i.e. in equivalent circuit or functional terms. If desired, of course, more than one level even a variable proportionate control of effective resistance could be provided, though the "normal" and very low (even "off" if preferred) alternative represents a particularly simple viable system.

Frequency of operation could be left as a matter of achieving resonance for an inductive coil including its coupling to the battery, typically metal electrode material. Then changing frequency to follow resonance according to battery state of charge can be converted into correspondingly changing voltage. Circuitry for a conventional inductive proximity sensor is suitable or readily adapted to the purposes hereof, and is shown in highly simplified form in FIG. 7. There, inductance coil 70 is driven by variable frequency oscillator 72 in a resonance achieving manner according to coupling with battery material 74, and a frequency to voltage converter 76 gives requisite charge state sensing voltage VS at output 78. The inductance coil 70 is conveniently located touching the battery case and axially aligned with one negative plate.

Alternatively, of couse, current/voltage variation for a fixed frequency could be used as above relative to FIG. 1.

Figures 8A, 8B:
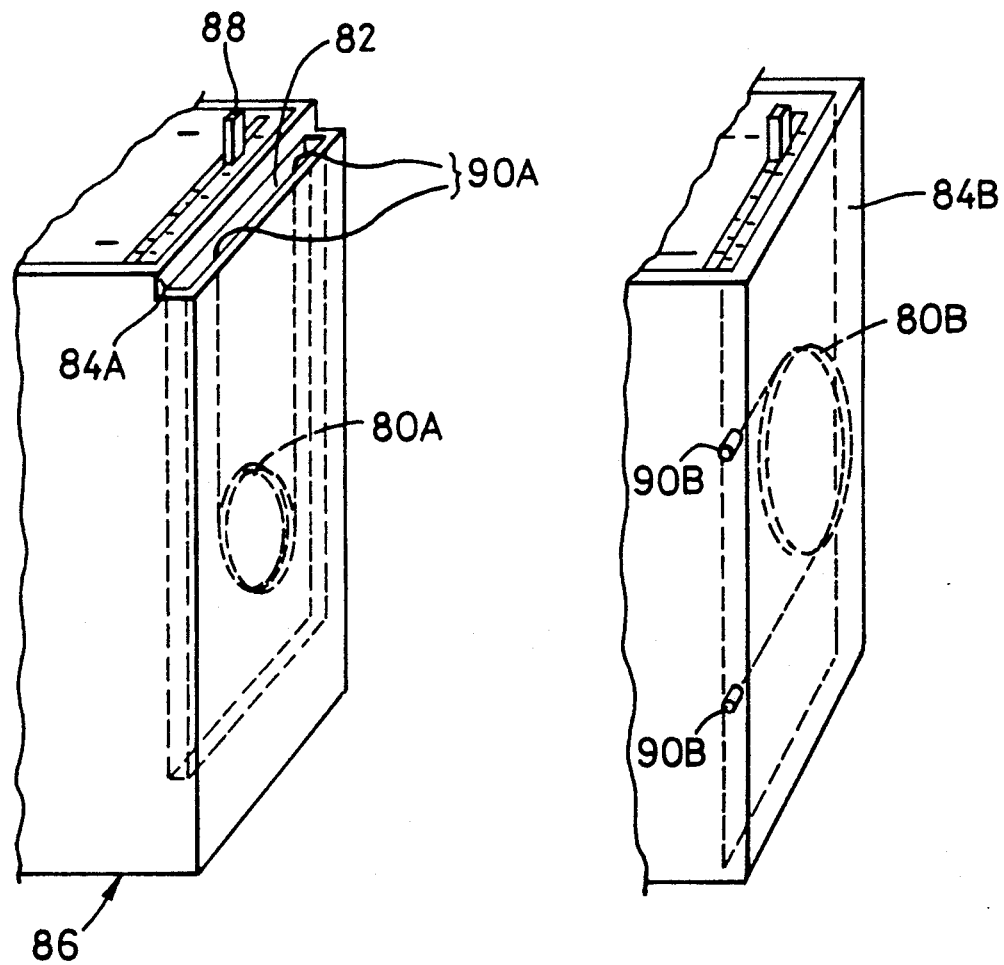
FIGS. 8A and 8B are fragmentary views showing installation/incorporation of a coil relative to a battery casing.

Apparatus for practising this invention could be a simple probe pack capable of being brought into suitable proximity to a battery, or a pack that can be attached to a battery casing. However, another approach is to form the battery casing with a pocket to house an inductive probe or probe pack, see FIG. 8A at 80A for the inductive coil probe end 82 for the pocket on an end wall 84A of the battery casing 86 next to negative electrode terminal 88 and with flying leads 90A for connection of the probe 80A to excitation/detection circuitry. A further approach is shown in FIG. 8B where inductive coil probe 80B is shown embedded in the thickness of end wall 84B and has connection studs 90B at the edge of that wall.

I claim:

1. A method of monitoring state of charge of an electric storage battery comprising the steps of:
   deliberately inducing eddy currents in conductive metallic constituents of negative plate material of the battery concerned;
   detecting effects representative of said eddy currents; and
   determining the state of charge of the battery based on the detected eddy current effects.

2. A method according to claim 1, wherein:
   an induction coil is used for inducing eddy currents by placing the induction coil in eddy-current inducing relation with the battery and applying to the induction coil an electric signal having a frequency of at least one kilohertz; and
   detection is according to at least one of amplitude and frequency effects in that signal.

3. Method according to claim 2, wherein said electrical signal is at a frequency not substantially exceeding ten megahertz.

4. Method according to claim 3, wherein said electrical signal frequency does not substantailly exceed 300 kHz.

5. Method according to claim 3, wherein said electrical frequency is not below 50 kHz.

6. Method according to claim 2, wherein said electrical signal is at a frequency in the range from 50 kHz to 100 kHz.

7. A method according to claim 2, wherein the coil is placed close to the outside of the battery case.

8. A method according to claim 2, wherein detecting effects representative of eddy currents is done by monitoring amplitude of the electrical signal causative of those eddy currents.

9. A method according to claim 8, wherein an initial value corresponding to full charge state of the battery concerned is obtained by measuring maximum amplitude of the high frequency signal applied while the battery is on floating charge.

10. Method according to claim 1, further comprising the step of indicating the state of charge of the battery.

11. Method according to claim 1, further comprising applying a charging current to said battery and limiting said charging current based on the state of charge as determined based on the detected eddy current effects as full charge of the battery is approached.

12. Apparatus for monitoring state of charge of an electric storage battery comprising induction coil means for deliberately inducing eddy currents in conductive metallic constituents of negative plate material of the battery concerned, means for supplying to said coil and eddy current inducing electrical energizing signal at a frequency of at least one kilohertz, means for detecting amplitude and/or frequency effects representative of said eddy currents, and means for determining the state of charge of the battery based on the detected effects representative of said eddy currents.

13. Apparatus according to claim 12, wherein the coil is housed in a formation made in a container for the battery electrodes and electrolyte.

14. Apparatus according to claim 12, further comprising signal processing means for calculating state of charge and discharge time of the battery concerned, and display means for displaying one or both of said state of charge and discharge time calculated therein.

15. Apparatus according to claim 12, further comprising an alternating current generator with associated rectifying and voltage regulating means for battery charging current, and means for preventing thermal runaway of battery charging by operating switching means causing battery charging current to be lowered in dependence on detected eddy currents during battery charging.

16. Apparatus according to claim 12, wherein said induction coil is operative on a resonance-achieving basis, said means for detecting including a variable frequency oscillator and a frequency-to-voltage converter.

* * * * *